(12) United States Patent
Yuan et al.

(10) Patent No.: US 7,319,623 B1
(45) Date of Patent: Jan. 15, 2008

(54) METHOD FOR ISOLATING A FAILURE SITE IN A WORDLINE IN A MEMORY ARRAY

(75) Inventors: Caiwen Yuan, Union City, CA (US); Susan Xia Li, Fremont, CA (US); Andy Gray, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 538 days.

(21) Appl. No.: 10/981,026

(22) Filed: Nov. 4, 2004

(51) Int. Cl.
*G11C 7/00* (2006.01)
(52) U.S. Cl. .................. 365/201; 714/718; 714/720
(58) Field of Classification Search ............ 365/201; 714/718, 720
See application file for complete search history.

(56) References Cited

U.S. PATENT DOCUMENTS

| | | | | |
|---|---|---|---|---|
| 4,310,901 A | * | 1/1982 | Harding et al. | 714/710 |
| 4,852,058 A | * | 7/1989 | Ohkawa | 365/94 |
| 5,386,423 A | * | 1/1995 | Koo et al. | 714/726 |
| 5,619,460 A | * | 4/1997 | Kirihata et al. | 365/201 |
| 6,144,210 A | * | 11/2000 | Brooks | |
| 6,260,166 B1 | * | 7/2001 | Bhavsar et al. | 714/727 |
| 6,330,696 B1 | * | 12/2001 | Zorian et al. | 714/720 |
| 6,392,945 B2 | * | 5/2002 | Sato | 365/214 |
| 6,407,953 B1 | * | 6/2002 | Cleeves | 365/201 |
| 6,433,561 B1 | * | 8/2002 | Satya et al. | 324/753 |
| 6,442,720 B1 | * | 8/2002 | Koprowski et al. | 714/726 |
| 6,516,432 B1 | * | 2/2003 | Motika et al. | 714/732 |
| 6,524,873 B1 | * | 2/2003 | Satya et al. | 438/18 |
| 6,694,454 B1 | * | 2/2004 | Stanley | 714/30 |
| 6,807,645 B2 | * | 10/2004 | Angelotti et al. | 714/732 |
| 6,829,573 B1 | * | 12/2004 | Matsumoto et al. | 703/20 |
| 7,095,642 B1 | * | 8/2006 | Parent et al. | 365/51 |

FOREIGN PATENT DOCUMENTS

JP          409152464 A    *  6/1997

* cited by examiner

*Primary Examiner*—Viet Q. Nguyen
(74) *Attorney, Agent, or Firm*—Farjami & Farjami LLP

(57) ABSTRACT

According to one exemplary embodiment, a method for isolating a failure site in a leaky wordline in a memory array includes dividing said leaky wordline into an initial leaky wordline portion and an initial non-leaky wordline portion, where the initial leaky wordline portion has wordline-to-substrate leakage. The initial leaky wordline portion can be determined by using a passive voltage contrast procedure to illuminate the initial leaky wordline portion. The method further includes performing a number of division and identification cycles on the initial leaky wordline portion to determine a final leaky wordline portion. According to this exemplary embodiment, the final leaky wordline portion comprises a predetermined number of memory cells. The method further includes performing a cutting and imaging procedure on the final leaky wordline portion to isolate the failure site.

18 Claims, 4 Drawing Sheets

METHOD FOR ISOLATING A FAILURE SITE IN A WORDLINE IN A MEMORY ARRAY

1. Technical Field

The present invention is generally in the field of semiconductor devices. More particularly, the present invention is in the field of fault isolation is semiconductor devices.

2. Background Art

A common failure mode for flash memory devices, such as NOR-type flash memory devices, is leakage to substrate in one or more wordlines, which can prevent single or multiple memory sectors from being erased during an erase operation. By way of background, a flash memory device, such as a NOR-type flash memory device, includes a number of memory cells situated along a number of wordlines. For example, 1024 memory cells may be situated along each wordline. During a typical erase operation, a large negative voltage is applied to the wordlines to erase the memory cells situated along the wordlines. However, wordline-to-substrate leakage in a wordline can prevent the wordline from being biased to the appropriate negative voltage level required for the erase operation. Thus, it is important to locate a failure site that causes wordline-to-substrate leakage in a wordline.

Conventional fault isolation techniques include locating a failure site in a device by detecting a photon or thermal emission site. However, in many cases, no emission site can be detected for wordline-to-substrate leakage due to low leakage current and due to coverage of the failure site by interconnect metal layers, which block photon emission. Although leaky wordlines, such as wordlines exhibiting leakage to the substrate, can be identified through electrical testing procedures, it is very difficult to find the exact failure location in the leaky wordline without detecting an emission site.

In one conventional technique, a scanning electron microscope is used to inspect each memory cell along the leaky wordline to determine the failure site. However, since each wordline can include a large number of memory cells, using a scanning electron microscope to inspection each memory cell along the leaky wordline can be very time consuming and ineffective.

Thus, there is a need in the art for an effective method of locating a failure site in a leaky wordline in a flash memory device.

SUMMARY

The present invention is directed to method for isolating a failure site in a wordline in a memory array. The present invention addresses and resolves the need in the art for an effective method of locating a failure site in a leaky wordline in a flash memory device.

According to one exemplary embodiment, a method for isolating a failure site in a leaky wordline in a memory array includes dividing said leaky wordline into an initial leaky wordline portion and an initial non-leaky wordline portion, where the initial leaky wordline portion has wordline-to-substrate leakage. The leaky wordline can be divided by using a focused ion beam to cut the leaky wordline. The initial leaky wordline portion can be determined by using a passive voltage contrast procedure to illuminate the initial leaky wordline portion. The method further includes performing a number of division and identification cycles on the initial leaky wordline portion to determine a final leaky wordline portion. Each of the division and identification cycles can include forming an intermediate wordline portion and causing the intermediate portion to be illuminated if the intermediate wordline portion has wordline-to-substrate leakage.

According to this exemplary embodiment, the final leaky wordline portion comprises a predetermined number of memory cells. For example, the predetermined number of memory cells can be eight memory cells. The method further includes performing a cutting and imaging procedure on the final leaky wordline portion to isolate the failure site. The cutting and imaging procedure can include performing a number of incremental cuts and a corresponding number of images of the incremental cuts across the final leaky wordline portion to isolate the failure site, for example. Other features and advantages of the present invention will become more readily apparent to those of ordinary skill in the art after reviewing the following detailed description and accompanying drawings.

DETAILED DESCRIPTION OF THE INVENTION

Figure 1A:
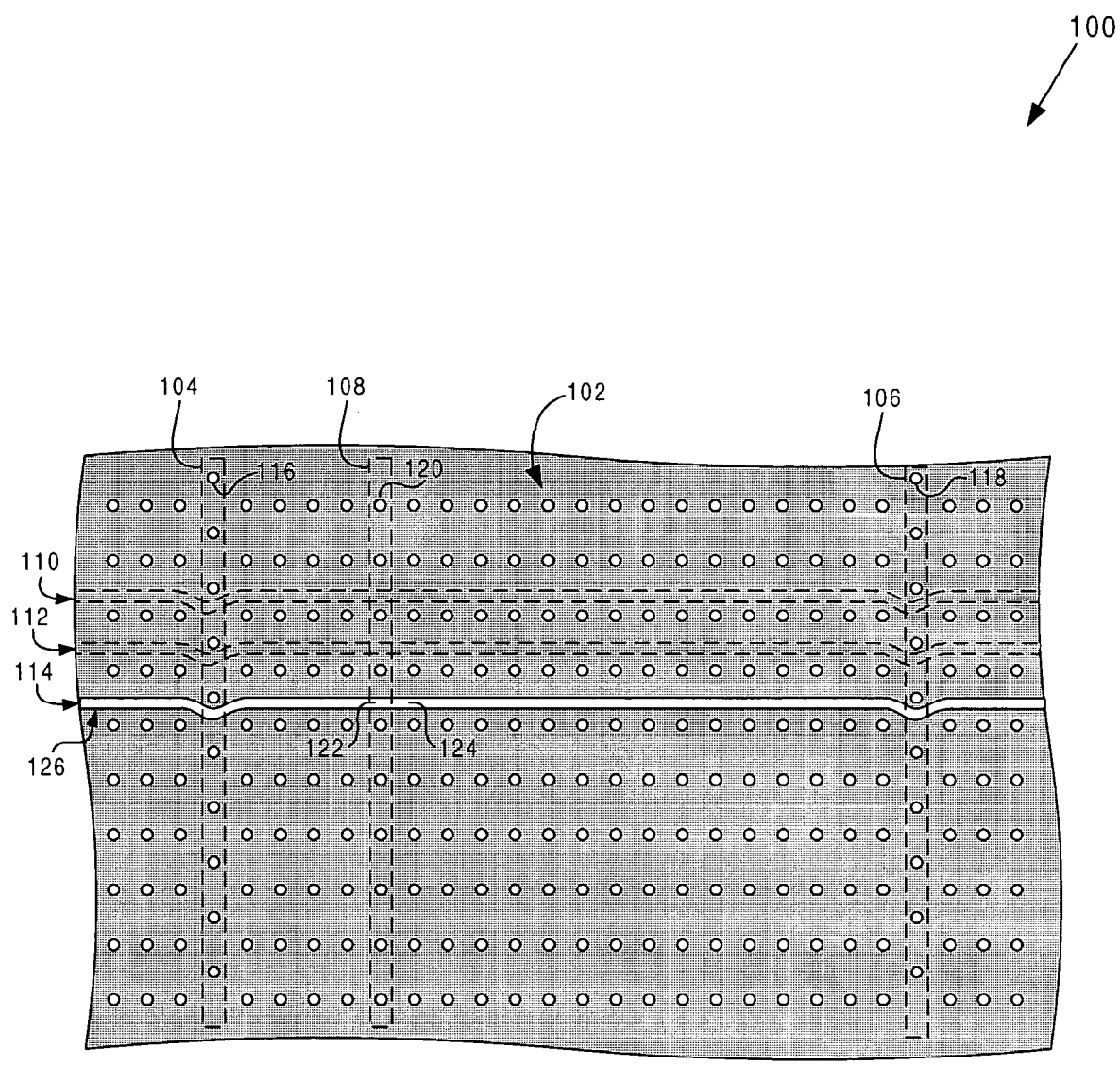
FIG. 1A illustrates a top view of an exemplary structure in accordance with one embodiment of the present invention.

The present invention is directed to method for isolating a failure site in a wordline in a memory array. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

The present invention provides an innovative method for isolating a failure site in a wordline, such as a wordline having leakage to ground, in a memory array. Although a flash memory array is utilized in the present embodiment to illustrate the invention, method of the present invention may be applied to other types of memory arrays, such as read-only-memory (ROM) memory arrays.

FIG. 1A shows a top view of an exemplary structure in accordance with one embodiment of the present invention. Structure 100 can be a portion of a flash memory array, such as a NOR-type flash memory array. Structure 100 includes interlayer dielectric layer 102, Vss contact columns 104 and 106, drain contact column 108, and wordlines 110, 112, and 114. FIG. 1A shows structure 100 after an interconnect metal layer has been removed to expose interlayer dielectric layer 102, Vss contact columns, such as Vss contact columns 104 and 106, and drain contact columns, such as drain contact column 108. FIG. 1A also shows structure 100 during performance of a passive voltage contrast procedure, which is used in the present invention's fault isolation process to indicate a leaky wordline that has wordline-to-substrate leakage.

As shown in FIG. 1A, Vss contact column 104 is aligned perpendicular to wordlines 110, 112, and 114, and comprises Vss contacts 116. Vss contacts 116 are formed in interlayer dielectric layer 102 and connect Vss lines (not shown in FIG. 1A) to a metal segment in an interconnect metal layer, which has been removed to expose interlayer dielectric layer 102. Each Vss line connects the sources of memory cells that are situated in a row. Vss contact column 106 comprises Vss contacts 118, which are similar to Vss contacts 116 discussed above.

Also shown in FIG. 1A, drain contact column 108 is aligned perpendicular to wordlines 110, 112, and 114, and comprises drain contacts 120. Drain contacts 120 are formed in interlayer dielectric layer 102 and connect the drains of memory cells, such as memory cell 122, to a bitline in an interconnect metal layer, which, as discussed above, has been removed to expose interlayer dielectric layer 102. It is noted that although only drain contact column 108 is described in detail herein to preserve brevity, structure 100 includes a number of drain contact columns, which are aligned perpendicular to wordlines, such as wordlines 110, 112, and 114.

Further shown in FIG. 1A, wordlines 110 and 112 are situated in structure 100 underneath interlayer dielectric layer 102 and aligned perpendicular to drain contact column 108 and Vss contact columns 104 and 106. Wordlines 110 and 112 each include a row of memory cells (not shown in FIG. 1A) and can comprise polycrystalline silicon (polysilicon). Also shown in FIG. 1A, wordline 114 is situated in structure 100 and aligned parallel to wordlines 110 and 112 and also aligned perpendicular drain contact column 108 and Vss contact columns 104 and 106. Wordline 114 includes a row of memory cells, such as memory cells 122 and 124, which are situated along wordline 114. It is noted that although only memory cells 122 and 124 are described in detail herein to preserve brevity, wordlines 110, 112, and 114 can each include a large number memory cells. It is also noted that although only wordlines 110, 112, and 114 are described in detail herein to preserve brevity, structure 100 can include a large number of wordlines.

Also shown in FIG. 1A, trench 126 is formed in interlayer dielectric layer 102 to expose the top surface of wordline 114. Trench 126 can be formed by a dry etch process, such as plasma etch process. Prior to the formation of trench 126, wordline 114 was identified as wordline having potential wordline-to-substrate leakage. After wordline 114 was identified as having potential wordline-to-substrate leakage, an interconnect metal layer situated over interlayer dielectric layer 102 was removed in a deprocessing procedure to exposed interlayer dielectric layer 102. The deprocessing procedure also exposed a contact (not shown in FIG. 1A) to wordline 114, which is typically situated at the end of a wordline, such as wordline 114. After the deprocessing procedure had been performed, a passive voltage contrast procedure was performed to determine if wordline 114 had wordline-to-substrate leakage.

By way of background, in a passive voltage contrast procedure, no bias voltage is applied to the circuit nodes of the memory array so that voltage contrast can be observed under scanning electron microscope inspection. During the passive voltage contrast procedure, an exposed wordline contact that is connected to a wordline that has wordline-to-substrate leakage will be illuminated since electrons in the electron beam generated by the scanning electron microscope will be conducted to the substrate through the exposed wordline contact and the leaky wordline. During the passive voltage contrast procedure, the wordline contact for wordline 114 was illuminated, which indicated that wordline 114 had leakage to the substrate.

After determining that wordline 114 had wordline-to-substrate leakage, i.e. that wordline 114 was a leaky wordline, trench 126 was formed in interlayer dielectric layer 102 to expose the top surface of wordline 114. Thus, as shown in FIG. 1A, wordline 114 is illuminated during the passive voltage contrast procedure as a result of wordline-to-substrate leakage. As will be discussed below in relation to FIGS. 1B and 1C, the present invention's failure site isolation process will be utilized to locate a failure site in wordline 114 that is causing wordline-to-substrate leakage.

Figure 1B:
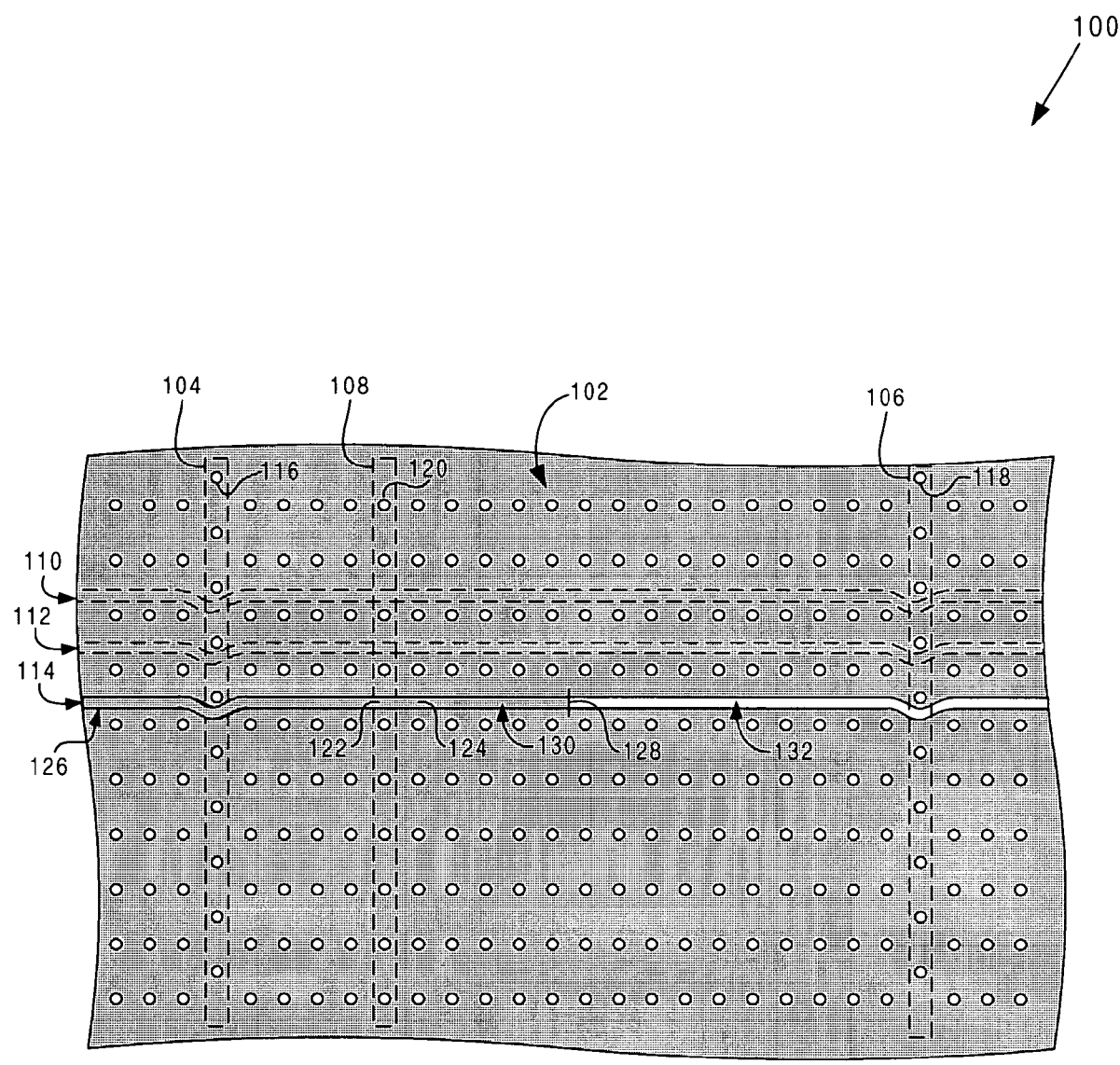
FIG. 1B illustrates a top view of an exemplary structure in accordance with one embodiment of the present invention.

FIG. 1B shows a top view of structure 100 of FIG. 1A after completion of process steps of an exemplary failure site isolation process in accordance with one embodiment of the present invention. In particular, interlayer dielectric layer 102, Vss contact columns 104 and 106, drain contact column 108, wordlines 110, 112, and 114, Vss contacts 116 and 118, drain contacts 120, memory cells 122 and 124, and trench 126 correspond to the same elements in FIGS. 1A and 1B. As shown in FIG. 1B, a cut is performed across the width of wordline 114 along line 128 to divide wordline 114 into wordline portions 130 and 132. Wordline 114 can be cut by using a focused ion beam, which can provide a cut having a desired thickness by appropriately adjusting beam size of the focused ion beam.

In the present embodiment, the length of the cut along line 128 can be approximately 1.0 micron, while the depth of the cut can also be approximately 1.0 micron. In other embodiments, the cut across wordline 114 may have a length and/or a depth greater than or less than 1.0 micron. The cut has a length that is greater than the width of wordline 114, which can be approximately 0.8 micron, for example. The cut is also performed between drain contacts to reduce damage to memory cells, which are situated on wordline 114 at the intersections of drain contact columns, such as drain contact column 108. In the present embodiment, a binary search procedure is used to efficiently locate a failure site in wordline 114. In the binary search procedure, wordline 114 is divided into two wordline portions, i.e. wordline portions 130 and 132, where wordline portion has approximately the same number of memory cells. In another embodiment, a search procedure other than a binary search procedure may be used to locate a failure site in wordline 114.

As discussed above, before wordline 114 had been cut, wordline 114 was illuminated during a passive voltage contrast procedure to indicate a leaky wordline, i.e. a wordline having wordline-to-substrate. After wordline 114 has been cut, the passive voltage contrast procedure is performed to determine which wordline portion, i.e. wordline portion 130 or 132, has wordline-to-substrate leakage. As shown in FIG. 1B, wordline portion 132 is illuminated and wordline portion 130 is not illuminated, which indicates that only wordline portion 132 has wordline-to-substrate leakage. It is noted that in the present application, wordline portion 132 is referred to as an "initial leaky wordline portion" and wordline portion 130 is referred to as an "initial non-leaky wordline portion."

If neither wordline portion 130 nor wordline portion 132 is illuminated during the passive voltage contrast procedure, residue at the location of the initial cut may be causing a short between wordline portion 130 and wordline portion 132. In such case, a clean cut procedure can be performed to remove any residue situated at the location of the initial cut. In the clean cut procedure, the focused ion beam is used to perform a clean cut over the initial cut using a solid box pattern having a length of approximately 1.0 micron, a width of approximately 0.5 micron, and a depth of approximately 0.01 micron. The solid box pattern is aligned over wordline 114 at the site of the initial cut such that the length of the solid box pattern is aligned across wordline 114, i.e. in a direction perpendicular to wordline 114, while the width of the solid box pattern is aligned along the length of wordline 114.

In the present embodiment, wordline portion 132 is then divided into two wordlines portions (not shown in FIG. 1B) having an approximately equal number of memory cells by using the focused ion beam to appropriately cut wordline portion 132. After wordline portion 132 has been cut into two wordline portions, the passive voltage contrast procedure is used to determine which wordline portion is illuminated, i.e. leaky, and which wordline portion is non-illuminated, i.e. non-leaky. The process of dividing the remaining illuminated wordline portion into two portions and using the voltage contrast procedure to identify the resulting illuminated wordline portion is continued until a final illuminated wordline portion comprising a predetermined number of memory cells is determined. In the present embodiment, the final illuminated wordline portion can comprise approximately eight memory cells. In other embodiments, the final illuminated wordline portion may comprise two or more memory cells.

In the division and identification process discussed above, if a cut does not divide a particular illuminated wordline portion into illuminated and non-illuminated wordline portions, the clean cut procedure discussed above is performed to re-cut that particular illuminated wordline portion. In the binary search procedure used in the present embodiment, the number of cuts required to determine a final illuminated wordline portion comprising a desired number of memory cells depends on the number of memory cells in wordline 114. By way of example, if wordline 114 comprises 1024 memory cells, a final illuminated wordline portion comprising eight memory cells can be achieved after seven cuts. It is noted that the final illuminated wordline portion is also referred to as a "final leaky wordline portion" in the present application. It is also noted that illuminated wordline portions and non-illuminated wordline portions that are formed in the division and identification process prior to determining the final illuminated wordline portion are referred to as "intermediate leaky wordline portions" and "intermediate non-leaky wordline portions," respectively, in the present application. In the present embodiment, the binary search procedure is used to efficiently provide a final illuminated wordline portion comprising a desired number of memory cells by using a minimum number of cuts.

The division and identification process discussed above comprises a number of division and identification cycles, where each successive division and identification cycle results in an illuminated wordline portion comprising a lower number of memory cells than a preceding illuminated wordline portion comprises. In particular, each successive division and identification cycle results in an illuminated wordline portion comprising one-half of the number of memory cells in the immediately preceding illuminated wordline portion. As will be discussed below in relation to FIG. 1C, the present invention's failure site isolation process will be further utilized to locate a failure site in a final illuminated wordline portion of wordline 114.

Figure 1C:
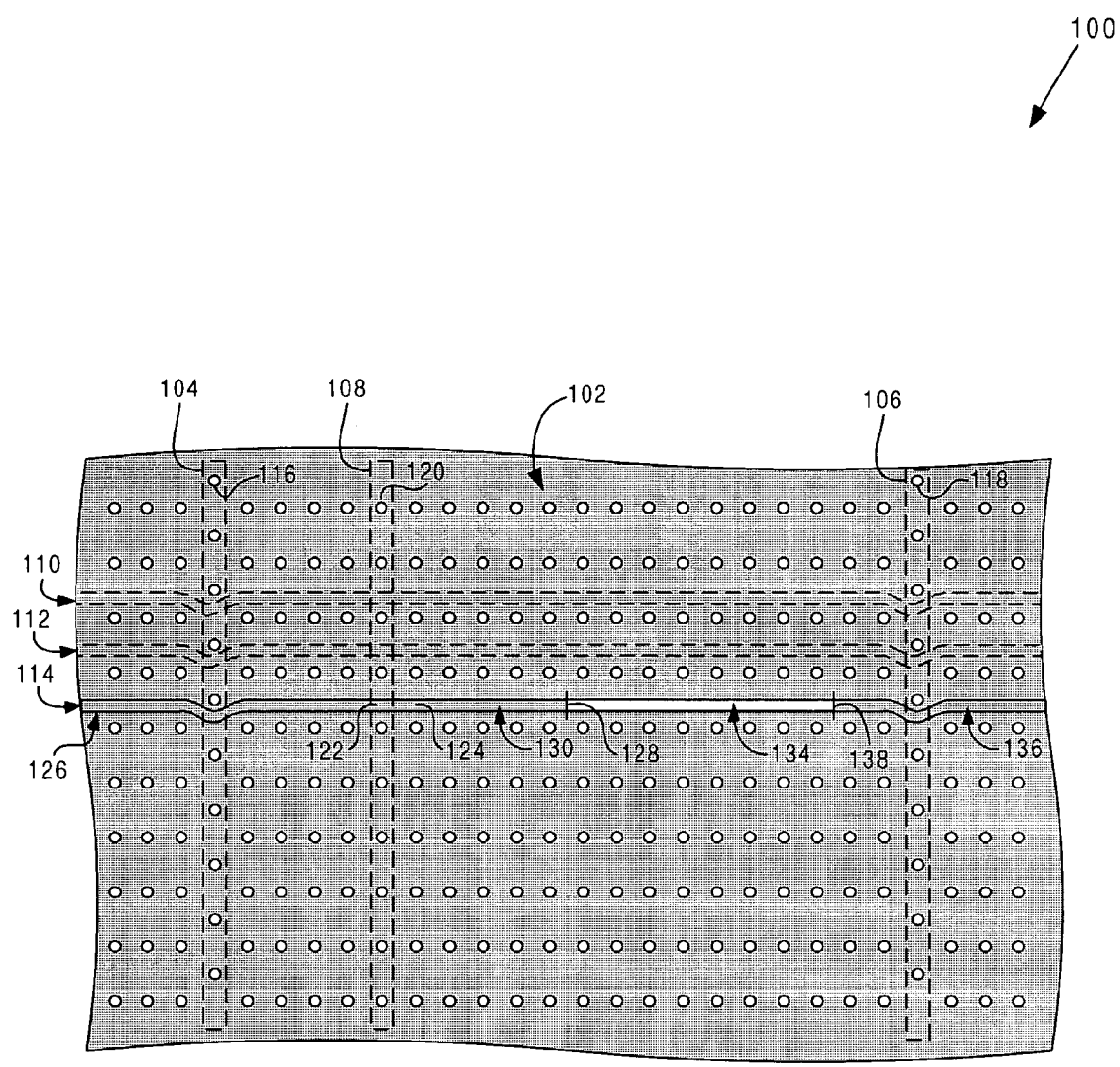
FIG. 1C illustrates a top view of an exemplary structure in accordance with one embodiment of the present invention.

FIG. 1C shows a top view of structure 100 of FIG. 1B after completion of process steps of an exemplary failure site isolation process in accordance with one embodiment of the present invention. In particular, interlayer dielectric layer 102, Vss contact columns 104 and 106, drain contact column 108, wordlines 110, 112, and 114, Vss contacts 116 and 118, drain contacts 120, memory cells 122 and 124, trench 126, line 128, and wordline portion 130 correspond to the same elements in FIGS. 1B and 1C. As shown in FIG. 1C, final illuminated wordline portion 134 is situated between wordline portion 130 and wordline portion 136, which are non-illuminated wordline portions. Final illuminated wordline portion 134 is determined by using the focused ion beam to cut a previous illuminated wordline portion of wordline 114 at line 138 and using the passive voltage contrast procedure to determine final illuminated wordline portion 134.

After final illuminated wordline portion 134 has been determined, a cutting and imaging procedure is performed to isolate the failure site in final illuminated wordline portion 134. In the cutting and imaging procedure, a focused ion beam is used to cut a section of final illuminated wordline portion 134 and an scanning electron microscope is used to form an image of the cut section. The image of the cut section formed by the scanning electron microscope can then be used to identify the precise location of the failure site in final illuminated wordline portion 134. For example, the image of the cut section formed by the scanning electron microscope may be compared to an image of a corresponding cut section from a non-leaky wordline to identify the failure site in final illuminated wordline portion 134.

In the cutting and imaging procedure, an appropriate number of incremental cuts and images can be performed across final illuminated wordline portion 134 to locate the failure site. For example, the incremental cuts and images can begin at one end of final illuminated wordline portion 134 and continuing toward the other end until the precise location of the failure site has been determined. In one embodiment, the cutting and imaging procedure can include simultaneously cutting and imaging across a section of final illuminated wordline portion 134 and a section of an adjacent non-leaky wordline, such as wordline 112. The image of the section of final illuminated wordline portion 134 can then be compared with a corresponding image of a section of a non-leaky wordline, such as wordline 110, to location the failure site. In one embodiment, the cutting and imaging procedure can include forming a cut and a corresponding image along the length of final illuminated wordline portion 134. The image of the cut formed along the length of final illuminated wordline portion 134 can be compared to an image of a corresponding cut formed along the length of a portion of a non-leaky wordline, such as wordline 112, to determine the location of the failure site.

Figure 2:
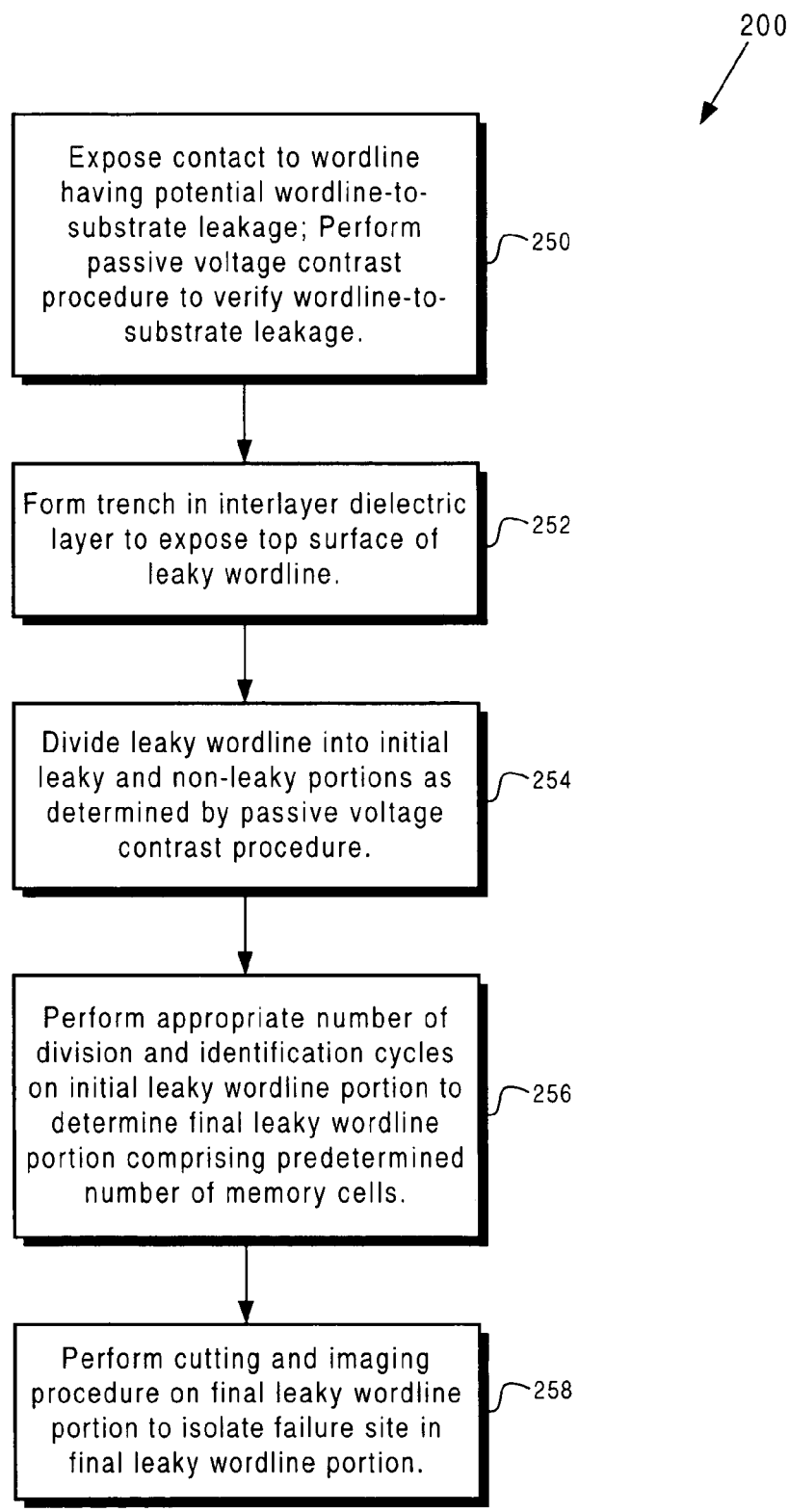
FIG. 2 is a flowchart corresponding to exemplary method steps according to one embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art. At step 250, a contact to a wordline, such as wordline 114 in FIG. 1A, having potential wordline-to-substrate leakage is exposed. For example, the contact of wordline 114, which is situated in interlayer dielectric layer 102, may be exposed by removing an interconnect metal layer situated over interlayer dielectric layer 102. A passive voltage contrast procedure is then performed to determine wordline-to-substrate leakage in wordline 114. For example, if the wordline contact is illuminated during the passive voltage contrast procedure, wordline 114 has wordline-to-substrate leakage.

At step 252, a trench, such as trench 126 in FIG. 1A, is formed in an interlayer dielectric layer, such as interlayer dielectric layer 102, to expose the top surface of a leaky wordline, such as wordline 114. The trench may be formed, for example, by using a plasma etch process. At step 254, the leaky wordline, such as wordline 114, is divided into initial leaky and non-leaky wordline portions, such as respective wordline portions 132 and 130 in FIG. 1B, as determined by the passive voltage contrast procedure. For example, a focused ion beam can be used to cut wordline 114 into wordline portions 130 and 132 and a passive voltage contrast procedure can be used to cause the initial leaky wordline portion, such as wordline portion 132, to be illuminated and, thereby, determine the leaky wordline portion.

At step 256, an appropriate number of division and identification cycles can be performed on the initial leaky wordline portion, such as wordline portion 132, to determine a final leaky wordline portion, such as final illuminated wordline portion 134 in FIG. 1C, where the final leaky wordline portion comprises a predetermined number of memory cells. For example, each division and identification cycle can including using the focused ion beam to cut a previous illuminated wordline portion into two wordline portions and using the passive voltage contrast procedure to determine the leaky portion by illuminating the leaky wordline portion.

At step 258, a cutting and imaging procedure is performed on the final illuminated wordline portion, such as illuminated wordline portion 134, to isolate the failure site in the final illuminated wordline portion. For example, the cutting and imaging procedure can including forming an appropriate number of incremental cuts across sections of final illuminated wordline portion 134 and forming a corresponding image of each cut section. The images of each cut section can then be used to locate the failure site in final illuminated wordline portion 134. For example, the images of each cut section may be compared with images of each corresponding cut section of a non-leaky wordline to locate the failure site.

Thus, as discussed above, the present invention's failure site isolation process utilizes a focused ion beam and a passive voltage contrast procedure on a leaky wordline in a memory array to effectively localize a failure site to a final leaky wordline portion of the leaky wordline. The present invention's failure site isolation process further utilizes a cutting and imaging procedure to determine the precise location of the failure site in the final leaky wordline portion that is causing wordline-to-substrate leakage. Moreover, the present invention efficiently localizes the failure site in the leaky wordline to the final leaky wordline portion by using a minimum number of wordline cuts.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive.

It should also be understood that the invention is not limited to the particular exemplary embodiments described herein, but is capable of many rearrangements, modifications, and substitutions without departing from the scope of the invention.

Thus, method for isolating a failure site in a wordline in a memory array has been described.

The invention claimed is:

1. A method for isolating a failure site in a leaky wordline in a memory array, said method comprising:
    etching a trench in an interlayer dielectric layer to expose a top surface of said leaky wordline, said leaky wordline comprising wordline-to-substrate leakage;
    dividing said leaky wordline into an initial leaky wordline portion and an initial non-leaky wordline portion;
    performing a plurality of successive identifications on said initial leaky wordline portion to determine a final leaky wordline portion;
    wherein said final leaky wordline portion comprises a predetermined number of memory cells.

2. The method of claim 1 further comprising a step of performing a cutting and imaging procedure to isolate said failure site.

3. The method of claim 2 wherein said cutting and imaging procedure comprises performing a plurality of incremental cuts and a corresponding plurality of images of said incremental cuts across said final leaky wordline portion to isolate said failure site.

4. The method of claim 2 wherein said cutting and imaging procedure comprises performing a cut and a corresponding image of said cut along a length of said final leaky wordline portion to isolate said failure site.

5. The method of claim 1 wherein said step of dividing said leaky wordline comprises using a focused ion beam to cut said leaky wordline.

6. The method of claim 1 wherein said step of performing a plurality of successive identifications comprises forming a plurality of intermediate leaky wordline portions, wherein each of said plurality of intermediate leaky wordline portions comprises a greater number of memory cells than said final leaky wordline portion.

7. The method of claim 1 wherein said failure site causes said wordline-to-substrate leakage.

8. The method of claim 1 wherein said memory array is a flash memory array.

9. The method of claim 1 wherein said predetermined number of memory cells comprises eight memory cells.

10. The method of claim 1 wherein said step of dividing said leaky wordline comprises using a passive voltage contrast procedure to illuminate said initial leaky wordline portion.

11. A method for isolating a failure site in a leaky wordline in a memory array, said method comprising:
    dividing said leaky wordline into an initial leaky wordline portion and an initial non-leaky wordline portion;
    performing a plurality of successive identifications on said initial leaky wordline portion to determine a final leaky wordline portion;
    wherein said final leaky wordline portion comprises a predetermined number of memory cells;
    performing a cutting and imaging procedure on said final leaky wordline portion to isolate said failure site, wherein said cutting and imaging procedure comprises performing a plurality of incremental cuts and a corresponding plurality of images of said incremental cuts across said final leaky wordline portion to isolate said failure site.

12. The method of claim 11 wherein said cutting and imaging procedure comprises performing a cut and a corresponding image of said cut along a length of said final leaky wordline portion to isolate said failure site.

13. The method of claim 11 wherein said step of dividing said leaky wordline comprises using a focused ion beam to cut said leaky wordline.

14. The method of claim 11 wherein said step of performing said plurality of successive identifications comprises forming a plurality of intermediate leaky wordline portions, wherein each of said plurality of intermediate leaky wordline portions comprises a greater number of memory cells than said final leaky wordline portion.

15. The method of claim 11 wherein said predetermined number of memory cells comprises eight memory cells.

16. The method of claim 13 wherein said step of dividing said leaky wordline further comprises determining said initial leaky wordline portion by using a passive voltage contrast procedure to illuminate said initial leaky wordline portion.

17. The method of claim 11 wherein each of said successive identifications comprises forming an intermediate wordline portion and causing said intermediate wordline portion to be illuminated if said intermediate wordline portion has said wordline-to-substrate leakage.

18. The method of claim 13 wherein said step of dividing said leaky wordline comprises dividing said leaky wordline into an illuminated wordline portion and a non-illuminated portion, wherein said illuminated wordline portion has said wordline-to-substrate leakage.

* * * * *